US007307851B2

(12) United States Patent
Dimarco (10) Patent No.: US 7,307,851 B2
(45) Date of Patent: Dec. 11, 2007

(54) MODIFIED IMA CABINET ARCHITECTURE

(75) Inventor: Mario Dimarco, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 1624 days.

(21) Appl. No.: 09/224,340

(22) Filed: Dec. 31, 1998

(65) Prior Publication Data

US 2002/0012237 A1    Jan. 31, 2002

(51) Int. Cl.
*H05K 5/00* (2006.01)
*H05K 5/04* (2006.01)
*H05K 5/06* (2006.01)

(52) U.S. Cl. ............. 361/753; 361/752; 361/796; 361/816; 361/818

(58) Field of Classification Search ............... 361/724, 361/726, 727–730, 736, 737, 752, 753, 756, 361/759, 796, 816, 818; 211/41.17, 26; 174/35 R, 174/35 GL
See application file for complete search history.

(56) References Cited

U.S. PATENT DOCUMENTS

| | | | | |
|---|---|---|---|---|
| 4,002,386 A | * | 1/1977 | McKenzie | 312/320 |
| 4,375,290 A | * | 3/1983 | Zucchi et al. | 277/12 |
| 4,477,862 A | | 10/1984 | Gonzales | |
| 4,685,032 A | | 8/1987 | Blomstedt et al. | |
| 4,689,721 A | | 8/1987 | Damerow et al. | |
| 4,716,497 A | * | 12/1987 | Craker | 361/736 |
| 4,736,274 A | * | 4/1988 | Davies et al. | 361/399 |
| 4,846,699 A | | 7/1989 | Glover et al. | |
| 5,351,019 A | | 9/1994 | McHugh et al. | |
| 5,375,724 A | * | 12/1994 | Mazura | 211/26 |
| 5,396,401 A | * | 3/1995 | Nemoz | 361/690 |
| 5,398,822 A | * | 3/1995 | McCarthy et al. | 211/41 |
| 5,402,319 A | * | 3/1995 | Schumaker et al. | 361/796 |
| 5,424,916 A | * | 6/1995 | Martin | 361/498 |
| 5,495,584 A | | 2/1996 | Holman, Jr. et al. | |
| 5,546,273 A | * | 8/1996 | Harris | 361/697 |
| 5,547,386 A | | 8/1996 | Fredberg | |
| 5,603,044 A | | 2/1997 | Annapareddy et al. | |
| 6,008,995 A | * | 12/1999 | Pusateri et al. | 361/796 |
| 6,166,919 A | * | 12/2000 | Nicolici et al. | 361/800 |

* cited by examiner

*Primary Examiner*—Tuan T. Dinh
(74) *Attorney, Agent, or Firm*—McDonnell Boehnen Hulbert & Berghoff LLP (57) ABSTRACT

An integrated modular avionics (IMA) cabinet for housing printed circuit board (PCB) modules includes a chassis configured with slots for receiving the PCB modules. The chassis of the IMA cabinet also includes a rear panel configured for connecting to connectors, wire harnesses, and the like. Additionally, the PCB modules include a front panel configured with screws for securing the PCB modules to the chassis of the IMA cabinet. The PCB modules also include retractable handles for transporting the PCB modules. The chassis of the IMA cabinet is also configured with ventilation holes for cooling the PCB modules. The IMA cabinet is further configured to be EMI/RFI resistant. In an exemplary embodiment, the IMA cabinet is configure such that substantially all of the electronic and/or computer components are disposed on the PCB modules and not in the IMA cabinet, thus reducing the overall cost of the IMA cabinet and facilitating easier and quicker reconfiguration, repair, and replacement of the PCB modules.

7 Claims, 13 Drawing Sheets

MODIFIED IMA CABINET ARCHITECTURE

BACKGROUND OF THE INVENTION

1. Field of the Invention

The present invention generally relates to a cabinet for housing printed circuit boards. More particularly, the present invention relates to an Integrated Modular Avionics (IMA) cabinet for housing printed circuit board modules in avionics systems for airplanes.

2. Description of the Related Art

In general, airplanes contain numerous electronic systems, such as avionics systems, cabin control systems, and energy maintenance systems. The electronic and computer components of these systems are typically disposed on printed circuit boards. In order to protect the printed circuit boards against electromagnetic interference (EMI), radio frequency interference (RFI), environmental contaminants, and vibrations, the printed circuit boards are typically contained in housings which are mounted on shelves in the airplane. Various standards relating to the dimensions and configurations of the printed circuit boards, the housings, and the shelves used in an airplane are described by the ARINC standards, which are generally well known in the art and can be obtained from ARINC Incorporated of Annapolis, Md.

Figure 1:
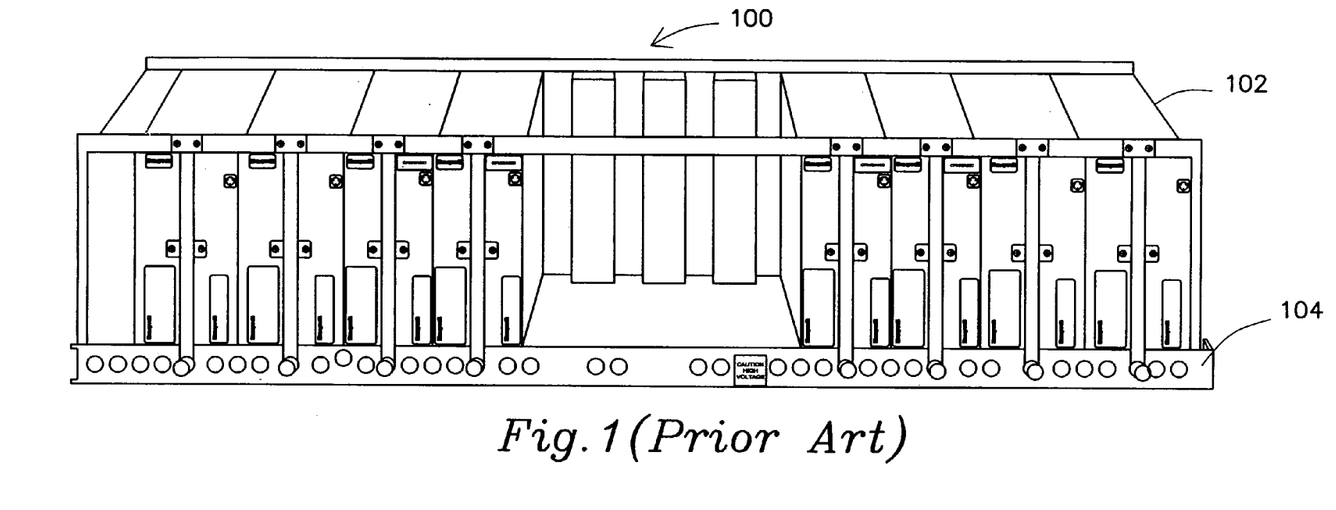
FIG. 1 is a perspective view of a prior art integrated modular avionics (IMA) cabinet.

With reference to FIG. 1, a conventional IMA cabinet 100 houses a number of modules 102 containing printed circuit boards. Each module 102 is individually enclosed in a case to protect the printed circuit boards contained within from EMI/RFI. Individually enclosing the modules 102, however, may increase the cost of the modules 102. The conventional IMA cabinet 100 also includes an air plenum 104 for distributing air to the modules 102 to cool the printed circuit boards. The air plenum 104, however, needs to be connected to an air supply, which may be cumbersome and expensive. Additionally, the modules 102 of the conventional IMA cabinet 100 are interconnected to each other and connected to wiring harnesses of the airplane through a circuit interface located at the rear of the conventional IMA cabinet 100. The circuit interface, however, may take up considerable amount of space. For example, in one conventional IMA cabinet, the circuit interface may take up as much as 5 inches out of a total of 20 inches available for the entire cabinet. Additionally, the circuit interfaces are typically difficult to repair or reconfigure.

Figure 2:
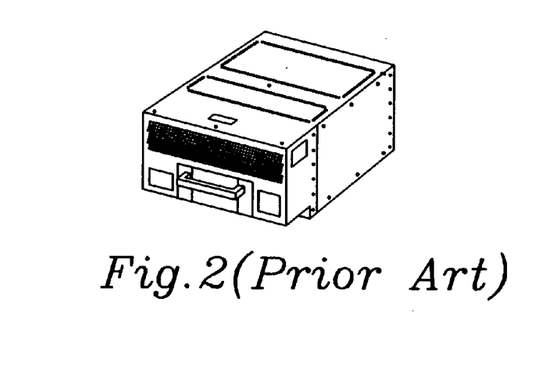
FIG. 2 is a perspective view of a prior art line replaceable unit (LRU)

With reference to FIG. 2, a conventional line replaceable unit (LRU) typically includes a housing 202 for enclosing the printed circuit boards. The LRU 200 also typically includes a motherboard or a bus system for interconnecting the printed circuit boards. Similar to the conventional IMA cabinet 100, however, the conventional LRU 200 is generally difficult to repair and/or reconfigure. In general, the entire LRU 200 is removed to repair or reconfigure the printed circuit boards, which may be costly and time consuming.

SUMMARY OF THE INVENTION

The present invention relates to an integrated modular avionics (IMA) cabinet for housing printed circuit board (PCB) modules. In accordance with an exemplary embodiment of the present invention, the IMA cabinet includes a chassis configured with slots for receiving the PCB modules. The chassis of the IMA cabinet also includes a rear panel configured for connecting to connectors, wire harnesses, and the like. Additionally, the PCB modules include a front panel configured with screws for securing the PCB modules to the chassis of the IMA cabinet. The PCB modules also include retractable handles for transporting the PCB modules. The chassis of the IMA cabinet is also configured with ventilation holes for cooling the PCB modules. The IMA cabinet is further configured to be EMI/RFI resistant. In an exemplary embodiment, the IMA-cabinet is configure such that substantially all of the electronic and/or computer components are disposed on the PCB modules and not in the IMA cabinet, thus reducing the overall cost of the IMA cabinet and facilitating easier and quicker reconfiguration, repair, and replacement of the PCB modules.

DESCRIPTION OF THE DRAWINGS

The subject matter of the invention is particularly pointed out and distinctly claimed in the concluding portion of the specification. The invention, however, both as to organization and method of operation, may best be understood by reference to the following description taken in conjunction with the claims and the accompanying drawing, in which like parts may be referred to by like numerals:

DETAILED DESCRIPTION OF THE PREFERRED EXEMPLARY EMBODIMENT

The subject matter of the present invention is particularly suited for use in connection with printed circuit boards, such as those used in electronic system in airplanes. As a result, an exemplary embodiment of the present invention is described in that context. It should be recognized, however, that such description is not intended as a limitation on the use or applicability of the present invention, but is instead provided to enable a full and complete description of the exemplary embodiment.

An Integrated Modular Avionics (IMA) cabinet according to various aspects of the present invention suitably provides for housing of printed circuit board (PCB) modules of an airplane's electronics system such as the avionics system, the cabin control system, the energy maintenance system, and the like. For example, an IMA cabinet can be configured to house the PCB modules of an airplane's avionics system. Accordingly, the PCB modules contain the various electronic and computer components to perform the various functions and processes of an airplane's avionics system, such as receiving flight data, displaying the flight data on monitors, and the like.

Figure 3:
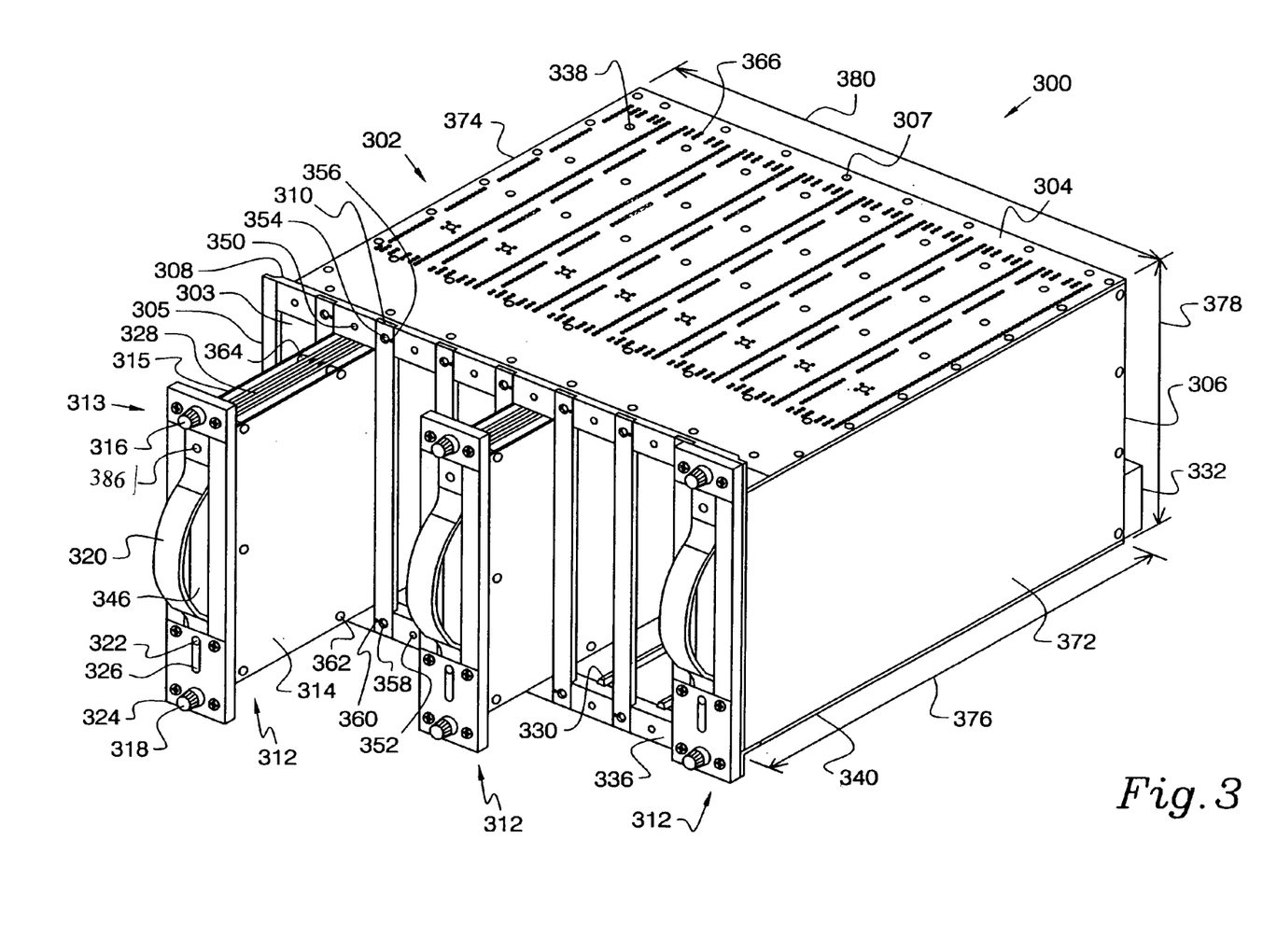
FIG. 3 is a perspective view of an IMA cabinet in accordance with various aspects of the present invention.
Figure 4:
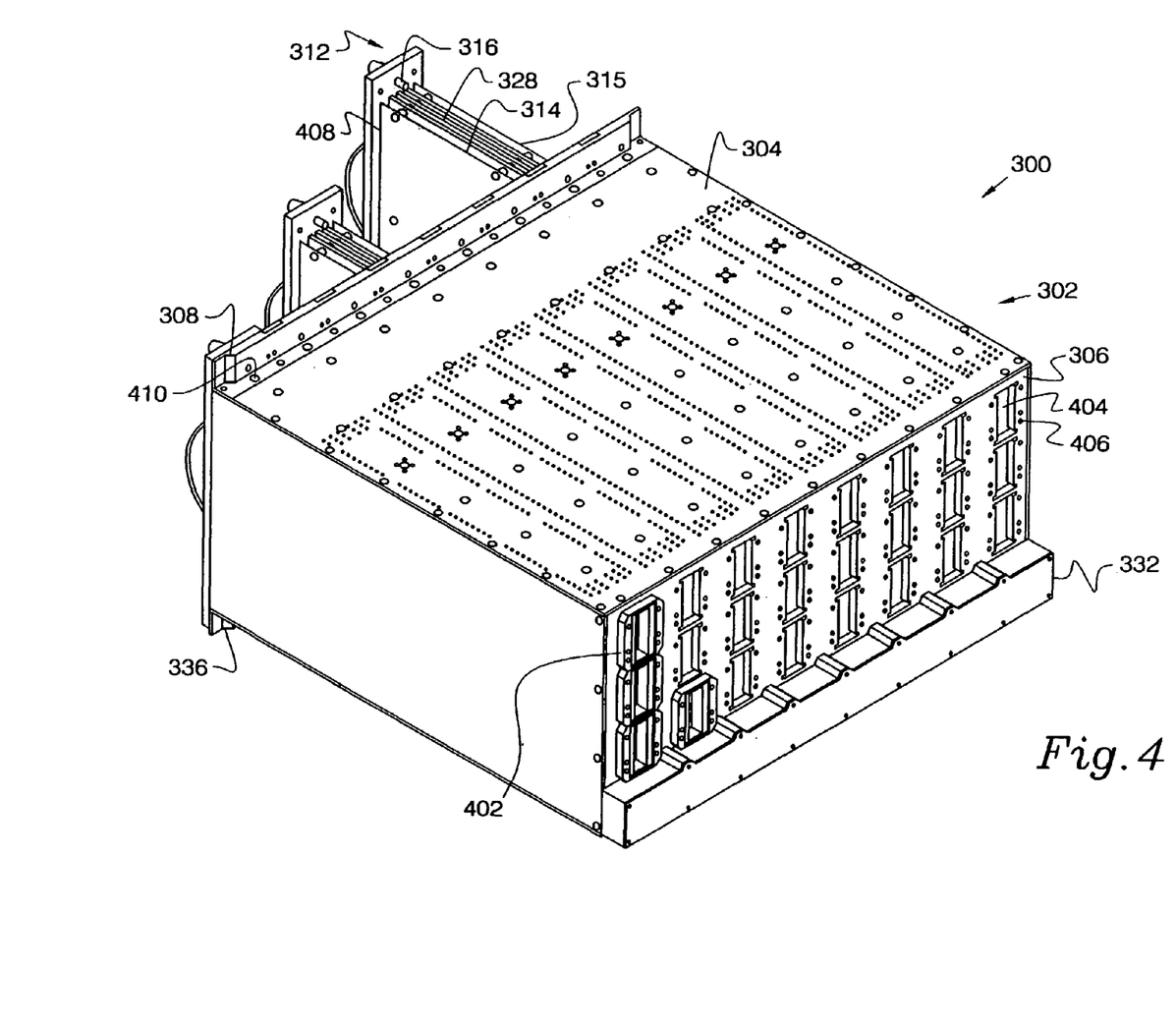
FIG. 4 is another perspective view of the IMA cabinet shown in FIG. 3.
Figure 5:
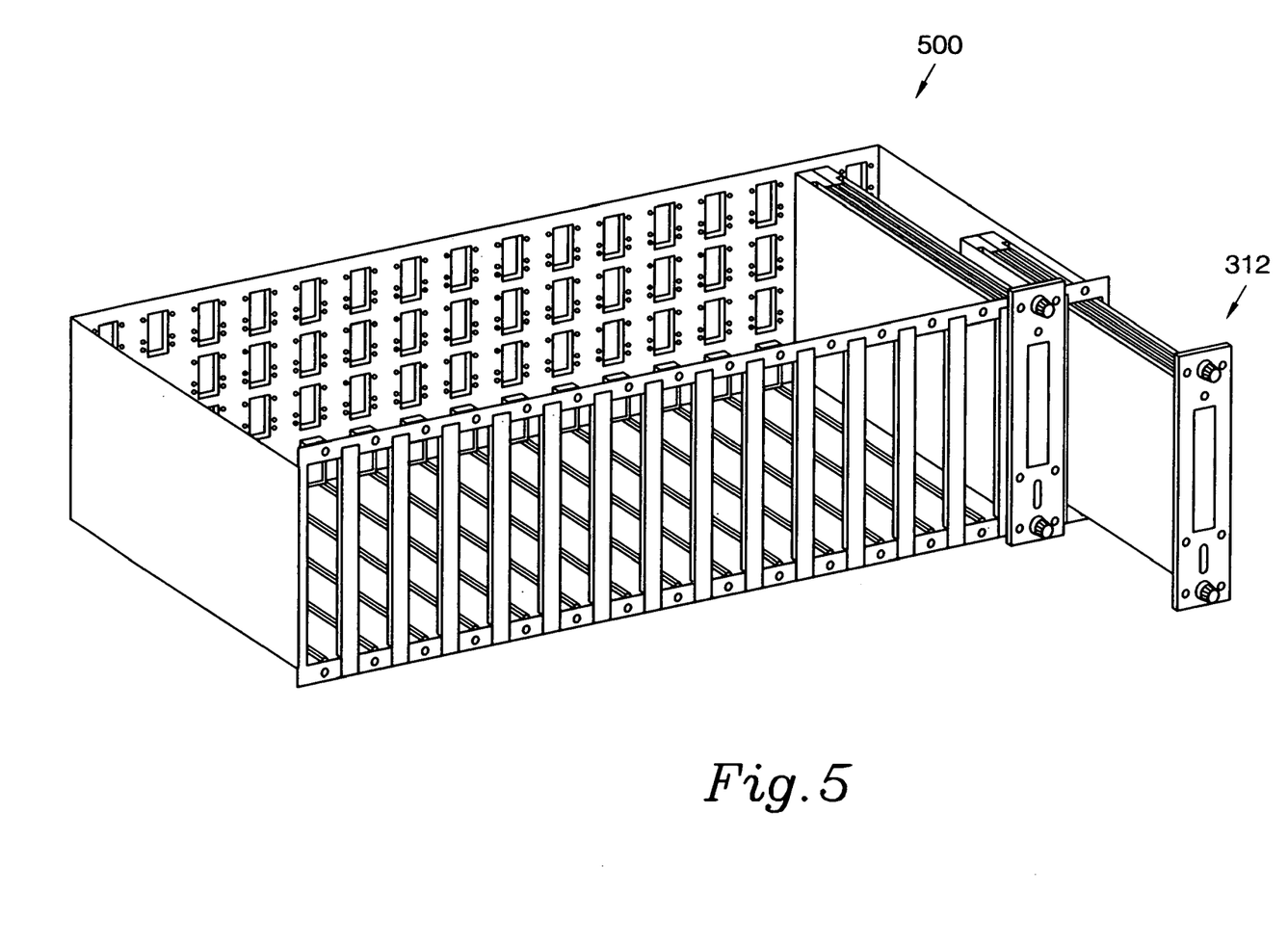
FIG. 5 is a perspective view of another IMA cabinet in accordance with various aspects of the present invention.

With reference to FIGS. 3 and 4, an IMA cabinet 300 according to various aspects of the present invention suitably includes a chassis 302 configured to house PCB modules 312 and to protect the PCB modules 312 against contaminants, electromagnetic interferences (EMIs), radio frequency interferences (RFIs), vibrations, and the like. As will be described in greater detail below, in an exemplary embodiment of the present invention, the IMA cabinet 300 preferably includes a front 305 configured with slots 303 for receiving the PCB modules 312 and a rear panel 306 configured for attaching connectors, wiring harnesses, and the like. Although in FIGS. 3 and 4 the IMA cabinet 300 is depicted as being configured to receive up to eight PCB modules 312, it should be appreciated that the IMA cabinet 300 can be configured to receive any number of PCB modules 312 for any particular application. For example, with reference to FIG. 5, an IMA cabinet 500 is suitably configured to receive up to 16 PCB modules 312.

With reference again to FIGS. 3 and 4, the chassis 302 according to various aspects of the present invention is suitably configured to mount onto an electronics shelf on the airframe of an airplane. Accordingly, the chassis 302 is suitably configured to comply with the dimensional requirements of an aircraft electronic shelf as specified by ARINC 600/650. However, it should be appreciated that the chassis 302 can be configured with any appropriate dimensions for any particular application, including variations of total length 376, total width 380, and total height 378 of the chassis 302.

The chassis 302 preferably includes a top panel 304, a bottom panel 340, and side panels 372 and 374 formed from any suitable rigid material, such as aluminum, steel, plastic, and the like. In an exemplary embodiment, the top panel 304, the bottom panel 340, and the side panels 372 and 374 are preferably formed from about 0.09 inch thick sheets of aircraft quality aluminum which are EMI/RFI resistant. Additionally, the top panel 304, the bottom panel 340, and side panels 372 and 374 are preferably coated with anodyne or any other suitable material to resist corrosion.

The top panel 304, the bottom panel 340, and the side panels 372 and 374 of the chassis 302 are suitably joined using any convenient method such as fasteners, solders, welds, and the like. In an exemplary embodiment, the panels are joined together with screws 307 along the various seams formed between the top panel 304, the bottom panel 340, and the side panels 372 and 374. Additionally, the top panel 304 and the bottom panel 340 according to various aspects of the present invention are preferably interchangeable; meaning that the top panel 304 can be used as the bottom panel 340 and vice versa. Similarly, the side panels 372 and 374 are also interchangeable. In this manner, the top, bottom, and sides of the chassis 302 can be formed using two distinct panels rather than four distinct panels, thus simplifying assembly and reducing the number of required parts.

The interior surfaces of the top and the bottom panels 304 and 340 suitably include a plurality of guide rails 330 for guiding the PCB modules 312 into and out of the chassis 302. Accordingly, the guide rails 330 are preferably formed from a low friction material such as nylon, metal, and the like. Additionally, the guide rails 330 can be attached to the interior surfaces of the top and bottom panels 304 and 340 using any convenient method such as fasteners, adhesives, and the like. In the present exemplary embodiment, the guide rails 330 are nylon hex bars attached to the interior surfaces of the top and bottom panels 304 and 340 with bolts. Accordingly, the top and bottom panels 304 and 340 are preferably formed with drill holes 338 for the bolts to attach the guide rails 330. Additionally, each slot 303 in the chassis 302 is configured with two guide rails 330 (one guide rail 330 attached to the top panel 304 for each slot 303 and another guide rail 330 attached to the bottom panel 340 for each slot 303). The guide rails 330 are also preferably centered in each slot 303 such that when the PCB module 312 is inserted into the slot 303, the PCB module 312 is supported by a guide rail 330 along the center of the top edge of the PCB module 312 and along the center of the bottom edge of the PCB module 312. Supporting the PCB module 312 with the guide rails 330 along the center of the top and bottom edges of the PCB module 312 facilitates symmetric cooling of the PCB module 312.

The top and bottom panels 304 and 340 also suitably include a plurality of ventilation holes 366. As will be described in greater detail below, rows of ventilation holes 366 are formed on the top and bottom panels 304 and 340 to facilitate the circulation of air through the chassis 302 to cool the PCB modules 312. In an exemplary embodiment of the present invention, a row of ventilation holes 366 is formed on each side of each guide rail 330 on the top panel 304 and the bottom panel 340. Accordingly, with reference to FIG. 3, a row of ventilation holes 366 is formed on each side of the bolt holes 338 for attaching each guide rail 330 on the top panel 304 and the bottom panel 340. Additionally, in accordance with various aspects of the present invention, the ventilation holes 366 are suitably sized to be EMI/RFI resistant. Accordingly, in the present exemplary embodiment, the ventilation holes 366 have diameters less than about 0.09 inches.

As described above, with reference to FIGS. 3 and 4, the front 305 of the chassis 302 suitably includes the slots 303 for receiving the PCB modules 312. In the present exemplary embodiment, the front 305 of the chassis 302 preferably includes an upper horizontal beam 308 and a lower horizontal beam 336 configured with slots to receive a plurality of vertical beams 310. The upper and lower horizontal beams 308 and 336 are suitably configured with positioning pins 356 and 360 to initially position the vertical beams 310 within the slots formed in the upper and lower horizontal beams 308 and 336. The vertical beams 310 are then bolted through bolt holes 354 and 358 formed in the vertical beams 310 and upper and lower horizontal beams 308 and 336. With particular reference to FIG. 4, the upper horizontal beam 308 is suitably attached to the top panel 304 with bolts 410. Similarly, the lower horizontal beam 336 is suitably attached to the bottom panel 340. It should be recognized, however, that the slots 303 for receiving the PCB modules 312 can be formed using any convenient method. For example, rather than using the horizontal and vertical beams 308, 336 and 310, the front 305 can be formed as a single piece.

Figure 7:
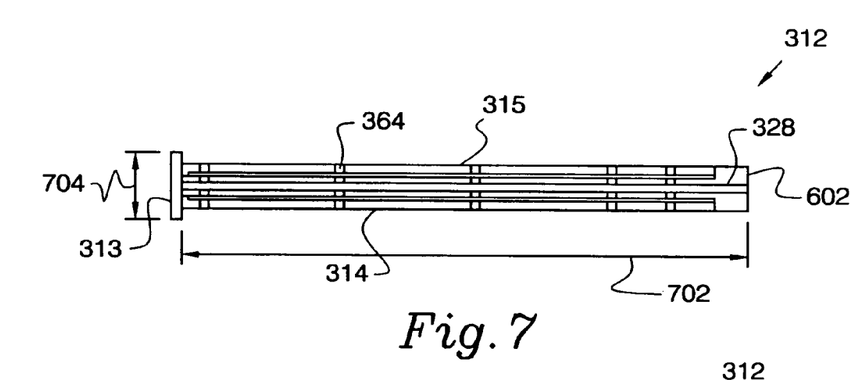
FIG. 7 is a top view of a printed circuit board (PCB) module in accordance with various aspects of the present invention.
Figure 8:
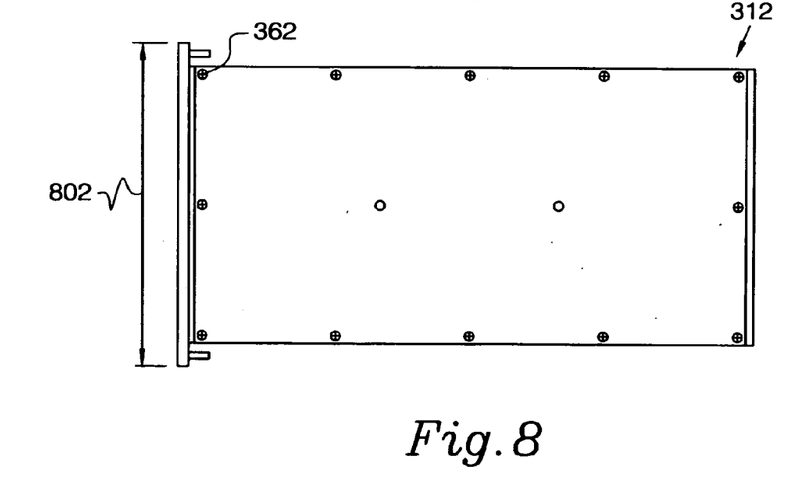
FIG. 8 is a side view of the PCB module shown in FIG. 7.
Figure 9:
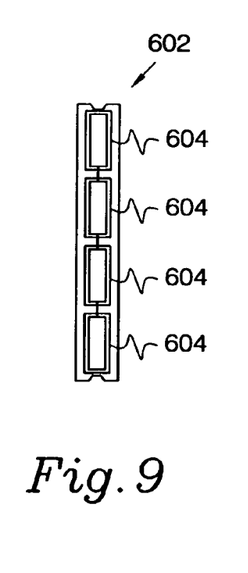
FIG. 9 is a rear view of the PCB module shown in FIG. 7.

With additional reference to FIGS. 7 to 9, the PCB module 312 suitably includes a face plate 313, printed circuit boards 314 and 315, and a connector assembly 602. For the sake of clarity and convenience, only one PCB module 312 will be described. As described above, in the present exemplary application of the present invention, the chassis 302 is suitably configured to comply with the dimensional requirements for an airplane electronics shelf as described by ARINC 600/650 standards. It should be recognized, however, that the PCB module 312 can be configured with any appropriate dimensions for any particular application, including variations in height 802, length 702, and thickness 704 of the PCB module 312. Additionally, thickness 704 of the PCB module 312 is suitably determined in part by the width and height of the components on the printed circuit boards 314 and 315.

As alluded to above, with reference again to FIGS. 3 and 4, the PCB modules 312 are suitably configured to be inserted into the slots 303 formed between adjacent vertical beams 310. Accordingly, the PCB modules 312 suitably include a groove 328 formed along the top and bottom edges of the PCB modules 312 to guide along guide rails 330 formed along the interior of the top and bottom panels 304 and 340. More particularly, as described above, each PCB module 312 is centrally supported along the top and bottom edges of the PCB module 312 by a guide rail 330.

The face plate 313 of the PCB module 312 suitably includes screws 316 and 318 for securing to holes 350 and 352 formed along the upper and lower horizontal beams 308 and 336, respectively. In the present exemplary embodiment, the screws 316 and 318 are suitably configured to apply a load of about 70 pounds each when fully tightened to secure the PCB module 312 within the chassis 302 against vibrations. However, the screws 316 and 318 can be configured to apply any desired load depending on the particular application. When the screws 316 and 318 are fully tightened, the screws 316 and 318 are suitably configured to clutch; meaning that the screws 316 and 318 can be turned without further tightening. Additionally, when the screws 316 and 318 clutch, they are further configured to self-latch; meaning that they cannot be extracted without being turned in the opposite direction. However, when the screws 316 and 318 are turned in the opposite direction, they loosen without clutching. In an exemplary embodiment, the screws 316 and 318 are about three quarters of an inch in diameter and are configured with size 3 threads with about 32 threads per inch. However, it should be recognized that screws 316 and 318 can be configured with various configuration and dimensions for any particular application.

In accordance with one aspect of the present invention, the screw 316 is suitably configured as a jack screw. Accordingly, when the screw 316 is loosened, the screw 316 moves the face plate 313 and thus the PCB module 312 away from the chassis 302. Similarly, when the screw 316 is tightened, the screw 316 moves the face plate 313 and thus the PCB module 312 toward the chassis 302. In this manner, the PCB module 312 can be more easily removed from and inserted into the chassis 302. It should be recognized that the screw 318 can be configured as a jack screw either instead of or in conjunction with the screw 316.

The face plate 313 of PCB module 312 suitably includes a retractable handle 320 which can be moved between a retracted position and a use position. In the retracted position, the retractable handle 320 retracts substantially flush with the surface of the face plate 313. Accordingly, the retractable handle 320 provides a convenient means of transporting the PCB module 312.

Figure 15:
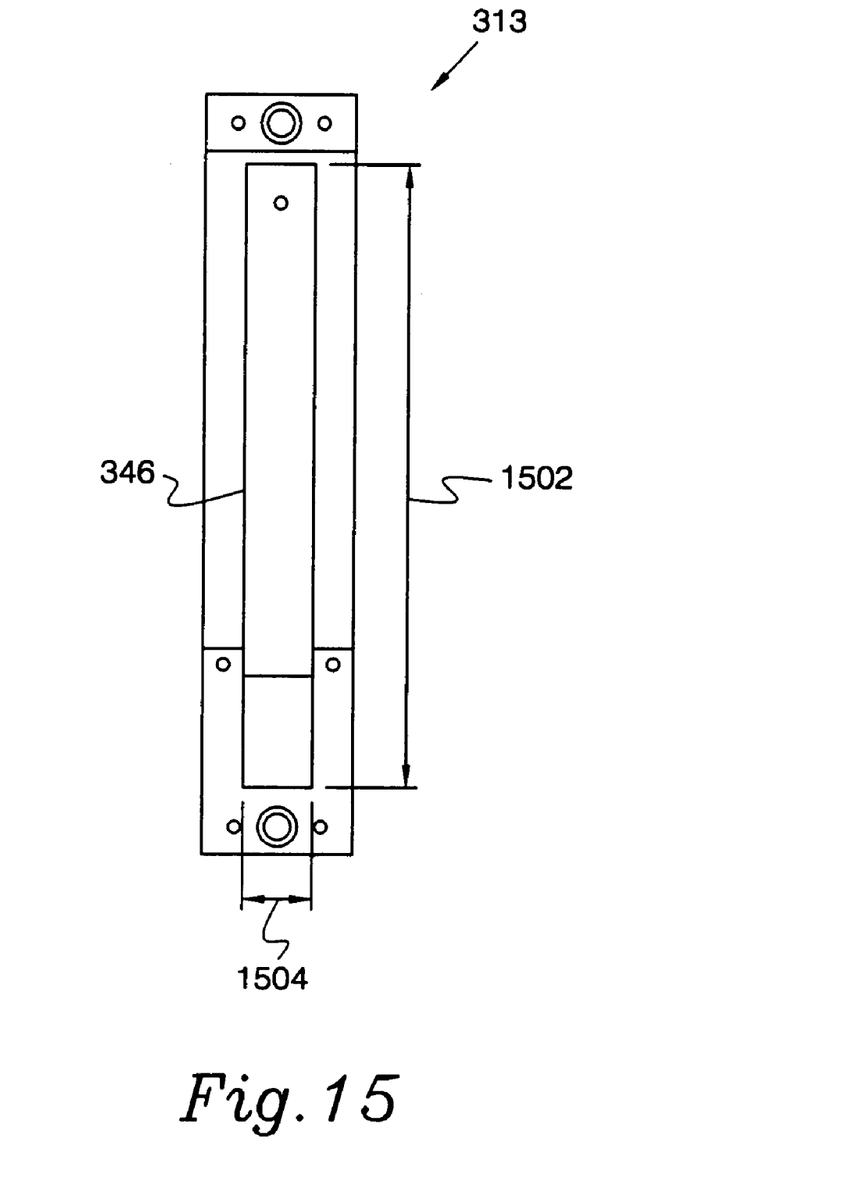
FIG. 15 is a front view of the PCB module shown in FIG. 7.
Figure 16:
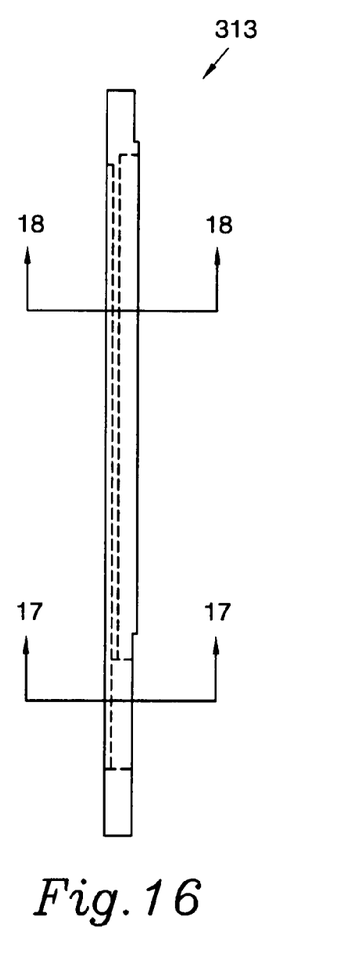
FIG. 16 is a side view of a portion of the PCB module shown in FIG. 7.
Figure 17:
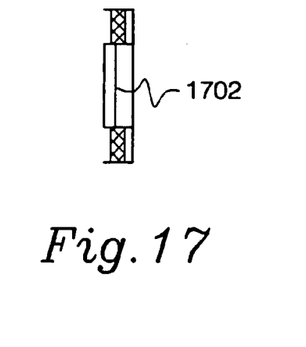
FIG. 17 is a cross sectional view of the PCB module shown in FIG. 16 taken through lines 17-17.
Figure 18:
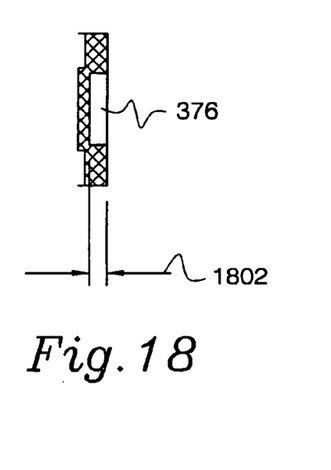
FIG. 18 is another cross sectional view of the PCB module shown in FIG. 16 taken through lines 18-18.

The face plate 313 according to various aspects of the present invention suitably includes a slot 346 for stowing the retractable handle 320 substantially flush with the surface of the face plate 313 when the retractable handle 320 is in a fully retracted position. In the present exemplary embodiment, with additional reference to FIG. 15, total height 1502 and total width 1504 of the slot 346 in the face plate 313 is about 7.29 and about 0.86 inches, respectively. Additionally, with reference to FIGS. 16 and 18, depth 1802 of the slot 346 formed in the face plate 313 is about 0.23 inches. It should be appreciated that the slot 346 formed in the face plate 313 can be formed with various dimensions and shape depending upon the particular application.

Figure 25:
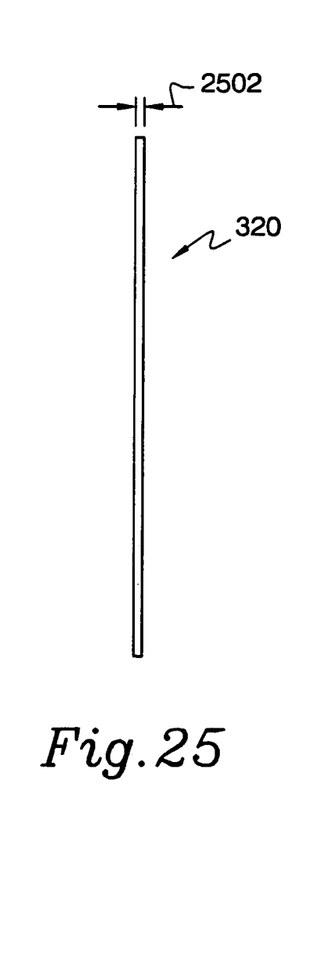
FIG. 25 is a side view of yet another portion of the PCB module shown in FIG. 7.

As stated above, with reference to FIGS. 3 and 4, when in a fully retracted position, the retractable handle 320 lies within the slot 346 formed in the face plate 313 and substantially flat with respective to the face plate 313. Accordingly, in the present exemplary embodiment, with reference to FIGS. 25 and 26, total height 2602, total width 2604, and total thickness 2502 of the retractable handle 320 is about 7.25, about 0.85 and about 0.20 inches, respectively. Additionally, the retractable handle 320 can be formed from any flexible and strong material such as nylon, plastic, and the like. In the present exemplary embodiment, the retractable handle 320 is a nylon strap.

Figure 23:
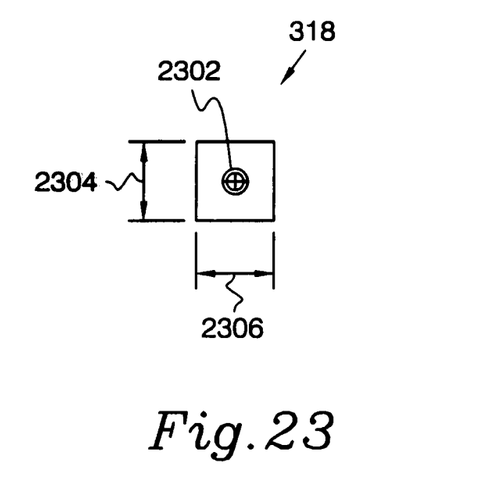
FIG. 23 is a front view of still another portion of the PCB module shown in FIG. 7.
Figure 24:
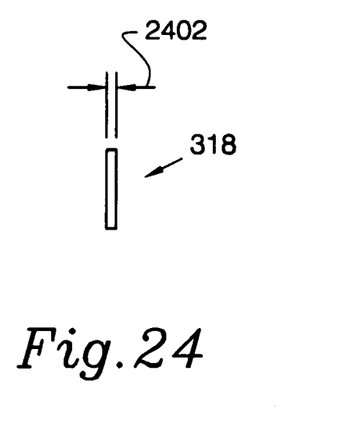
FIG. 24 is a side view of the portion of the PCB module shown in FIG. 23.
Figure 26:
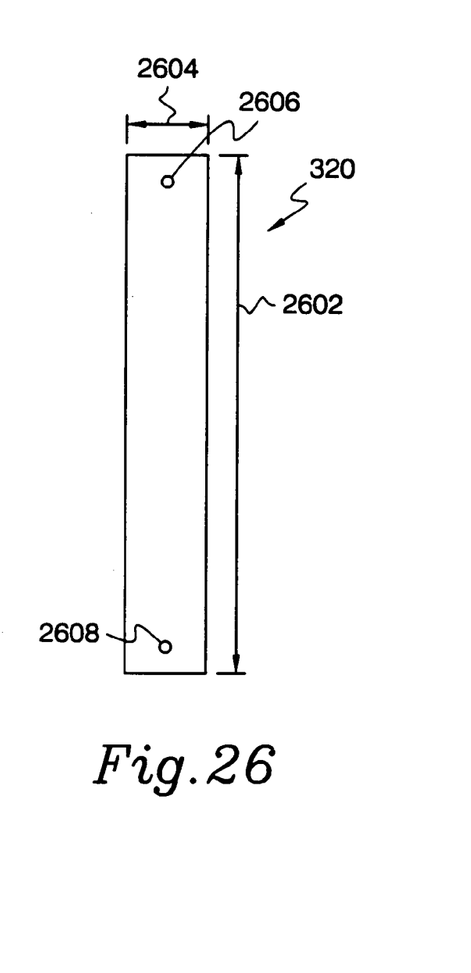
FIG. 26 is a front view of the portion of the PCB module shown in FIG. 25.

With reference to FIGS. 3 and 26, the retractable handle 320 according to various aspects of the present invention includes a top hole 2606 and a bottom hole 2608 for attaching the retractable handle 320 to the face plate 313 of the PCB module 312. With additional reference to FIGS. 23 and 24, the top hole 2606 of the retractable handle 320 is fixed to the top of the slot 346 with a retainer 386. More particularly, the top end of the retractable handle 320 is attached to the top of the slot 346 through the top hole 2606 formed in the retractable handle 320 and a hole 2302 formed in the retainer 386 by a fastener such as a bolt, pin, screw, and the like. In the present exemplary embodiment, total height 2304, total width 2306, and total thickness 2402 of the retainer 386 is about 0.90, about 0.860, and about 0.06 inches, respectively.

Figure 19:
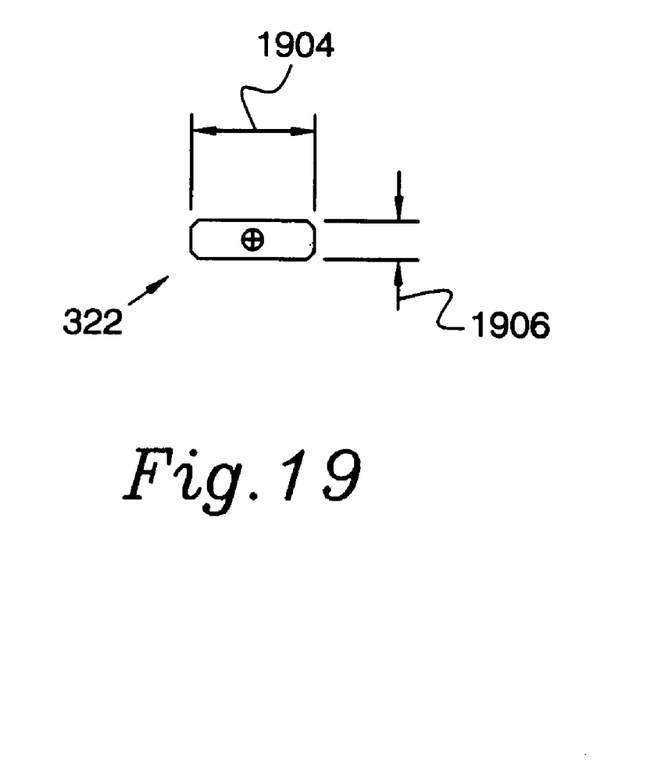
FIG. 19 is a front view of a portion of the PCB module shown in FIG. 7.
Figure 20:
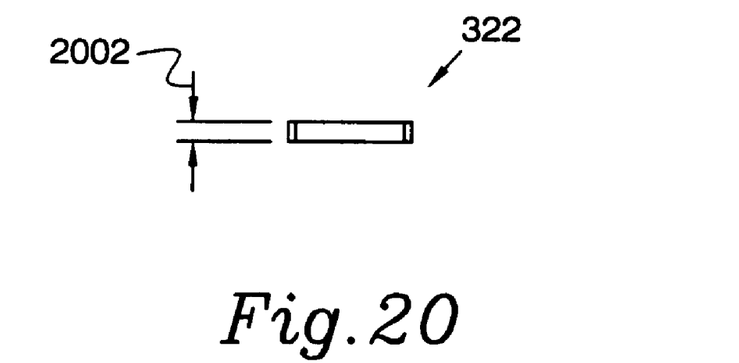
FIG. 20 is a side view of the portion of the PCB module shown in FIG. 19.
Figure 21:
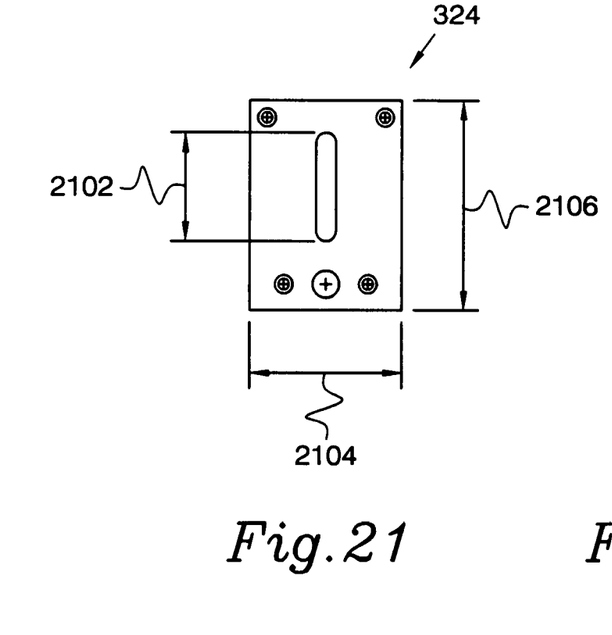
FIG. 21 is a front view of another portion of the PCB module shown in FIG. 7.
Figure 22:
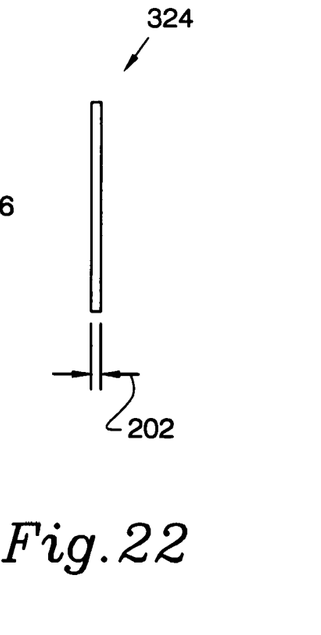
FIG. 22 is a side view of the portion of the PCB module shown in FIG. 21.

With reference again to FIGS. 3 and 26, the bottom hole 2606 of the retractable handle 320 is suitably connected to a slide block 322 which slides within a groove 326 formed in a bottom panel 324 of the face plate 313. More particularly, with additional reference to FIGS. 19 and 20, the bottom of the retractable handle 320 is suitably attached to the slide block 322 through the bottom hole 2606 formed in the retractable handle 320 and a hole 1902 formed in the slide block 322 by a fastener such as a bolt, pin, screw, and the like. The fastener used to attach the bottom of the retractable handle 320 to the slide block 322 then slides within the groove 326 formed in the bottom panel 324 of the face plate 313. Thus, while the top of the retractable handle 320 remains substantially fixed, the bottom of the retractable handle 320 is preferably free to move. Accordingly, when the retractable handle 320 is in a fully retracted position, the slide block 322 slides to the bottom of the groove 326. When the retractable handle 320 is in a use position, the slide block 322 slides to the top of the groove 326. Thus, with reference to FIG. 21, the range of movement of the bottom of the retractable handle 320 is defined by length 2102 of the grove 326. In an exemplary embodiment of the present invention, with reference to FIG. 21 and 22, total height 2106, total width 2104, and total thickness 2202 of the bottom panel 324 of the face plate 313 is about 2.415, about 1.810, and about 0.06 inches, respectively. Additionally, with reference to FIGS. 19 and 20, total length 1904, total width 1906, and total thickness 2002 of the slide block 322 is about 0.86, about 0.25, and about 0.14 inches, respectively.

With reference to FIGS. 3 and 4, the back of the face plate 313 of the PCB module 312 is suitably configured with seal 408 to be EMI/RFI resistant when the face plate 313 is tightened against the chassis 302. Accordingly, the seal 408 can include any compliant material which is EMI/RFI resistant. In the present exemplary embodiment, the seal 408 preferably includes metal finger springs 408 formed along the edges of the face plate 313.

Figure 10:
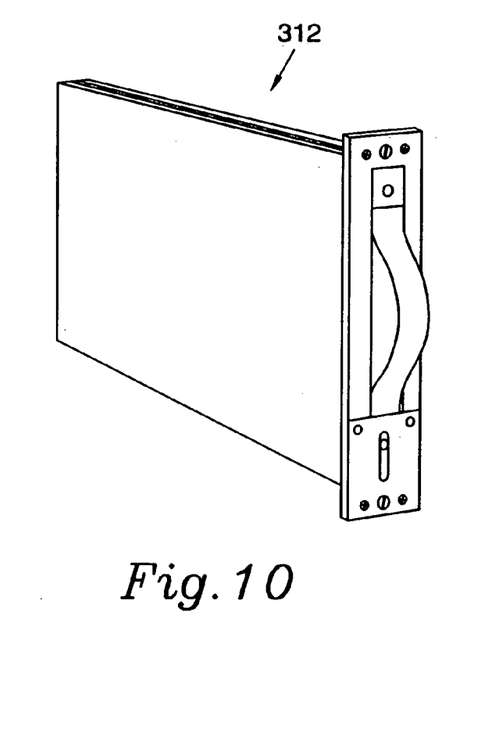
FIG. 10 is a perspective view of the PCB module shown in FIG. 7.
Figure 11:
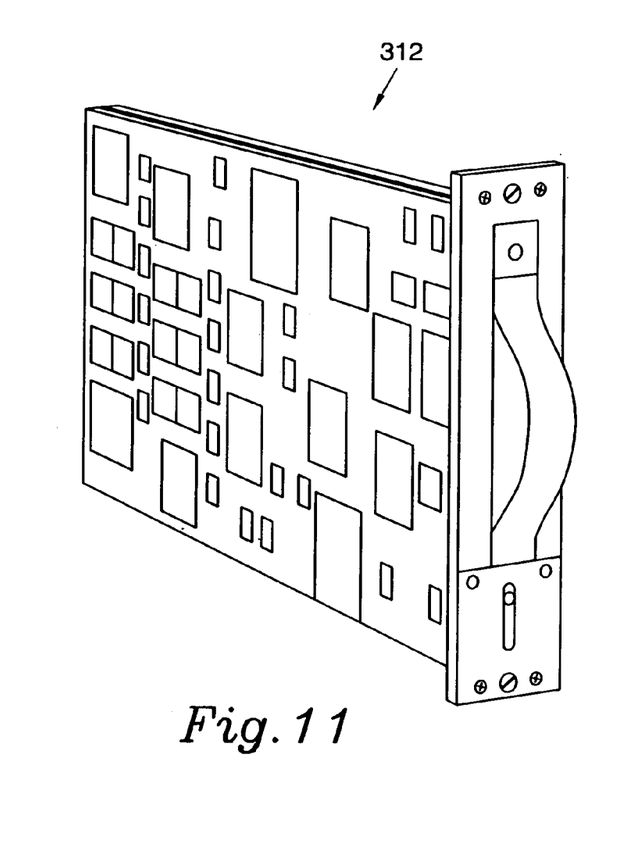
FIG. 11 is a perspective view of another PCB module in accordance with various aspects of the present invention.

As described above, the PCB module 312 according to various aspects of the present invention suitably includes any number of printed circuit boards containing electronic and/or computer components to perform various functions and processes depending on the particular application. In the present exemplary embodiment, with reference to FIGS. 7 and 9, the PCB module 312 preferably includes the printed circuit boards 314 and 315. The printed circuit boards 314 and 315 are preferably held together with screws 362 and separated by spacers 364 to form an air gap between the circuit boards 314 and 315 to facilitate cooling. Additionally, the backs of the printed circuit boards 314 and 315 are preferably configured with metal sheets which preferably function as heat sinks. With additional reference to FIGS. 3 and 4, the top and bottom panels 304 and 340 of the chassis 302 according to various aspects of the present invention are suitably configured with ventilation holes 366 which are formed in rows to align with the air gaps formed between the circuit boards 314 and 315. Additionally, with reference to FIGS. 10 and 11, the circuit boards 314 and 315 can be configured to face inward (FIG. 10), face outward (FIG. 11), or any combination thereof.

As described above, with reference to FIGS. 7 to 9, the PCB module 312 according to various aspects of the present invention suitably includes the connector assembly 602 for connecting to other PCB modules, wiring harnesses, and the like. In an exemplary embodiment, the connector assembly 602 of the PCB module 312 preferably includes four connectors 604, each configured as an ARINC 600 size 1 connector. However, the connector assembly 602 can include any number of connectors with various configurations for any particular application.

Additionally, the circuit boards 314 and 315 according to various aspects of the present invention are connected to the pins of the connectors 604 without using ribbon cables or loose wires. Rather, in an exemplary embodiment of the present invention, the circuit boards 314 and 315 are preferably connected to the pins of the connectors 604 using surface mounted leads, 90 degree leads, or the like. In this manner, as described in greater detail below, the PCB module 312 can be more easily removed from the chassis 302.

Figure 6:
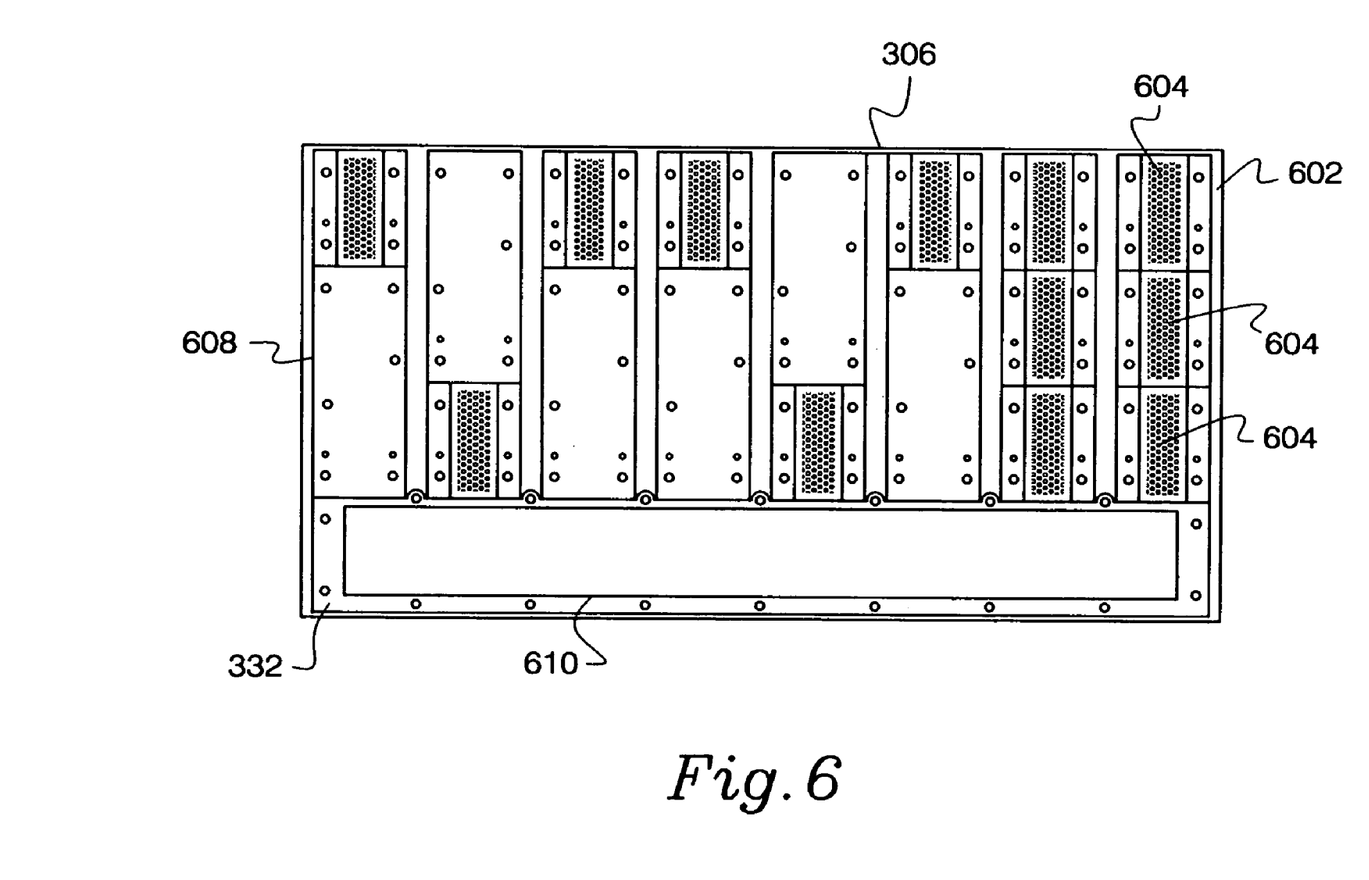
FIG. 6 is a rear view of the IMA cabinet shown in FIG. 3.
Figure 12:
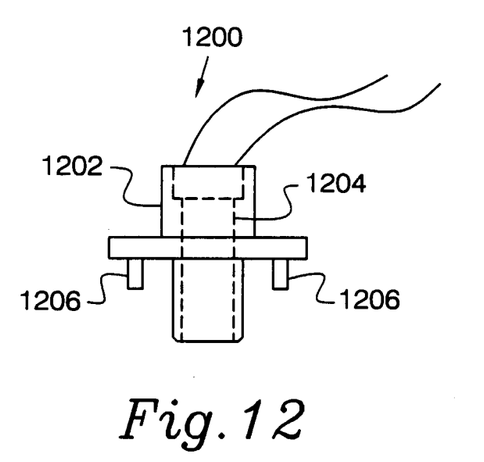
FIG. 12 is a top view of a wire harness in accordance with various aspects of the present invention.
Figure 13:
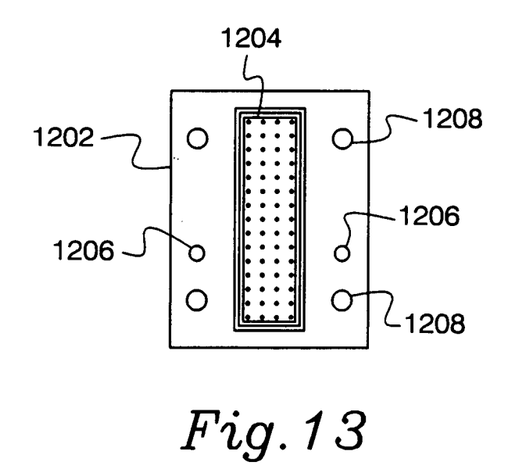
FIG. 13 is a front view of the wire harness shown in FIG. 12.
Figure 14:
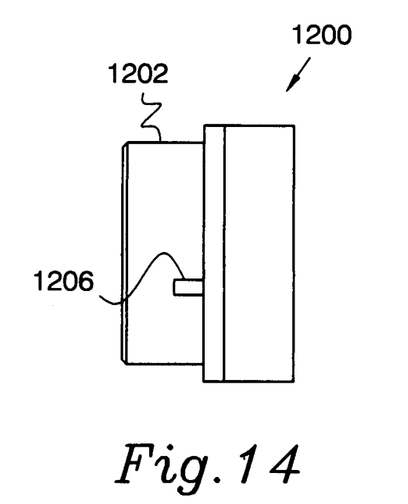
FIG. 14 is a side view of the wires harness shown in FIG. 12.

With reference to FIGS. 4 and 6, when the PCB module 312 is inserted into the chassis 302, the connectors 604 of the PCB module 312 are suitably accessible through connector openings 404 formed in the rear panel 306 of the chassis 302. Connector frames 402 are suitably attached to the connector openings 404 for connecting to connectors, wire harnesses, and the like. For example, with additional reference to FIGS. 12 to 14, a wiring harness 1200 suitably includes a connector 1204 and a shell 1202. The connector 1204 according to various aspects of the present invention is suitably configured as an ARINC 600 size 1 connector to connect with connectors 604 formed in the PCB module 312. Additionally, the shell 1202 of the wiring harness 1200 is suitably configured to connect with the connector frames 402 attached to the rear panel 304 of the chassis 302. More particularly, the frame 1202 suitably includes alignment pins 1206 for aligning the frame 1202 with the connector frames 402. The frame 1202 also suitably includes screws 1208 for securely attaching the frame 1202 to the connector frame 402. In this manner, the wiring harness 1200 is physically secured to the rear panel 306 of the chassis 302 rather than to the PCB modules 312. Therefore, the PCB modules 312 can be disconnected from the wiring harness 1200 without having to access the back panel 306 of the chassis 302 to loosen the screws 1208.

With reference to FIGS. 4 and 6, according to various aspects of the present invention, the PCB modules 312 are suitably interconnected with a common bus 610. The common bus 610 can be any high-speed and high-integrity backplane bus. In the present exemplary embodiment, the common bus 610 is a SAFEbus® bus available from Honeywell Inc. of Phoenix, Ariz. The common bus 610 is suitably enclosed within a cover 332 to protect the common bus 610 and to make the chassis 302 EMI/RFI resistant. In an exemplary embodiment of the present invention, the cover 332 is preferably formed from aircraft quality aluminum and attached to the chassis 302 using any convenient method, such as fasteners, solder, weld, and the like. Although the common bus 610 is depicted as being formed between the bottom connectors of PCB modules 312, it should be recognized that the common bus 610 can be formed between any of the connectors 604 on PCB modules 312.

As described above, the IMA cabinet 300 according to various aspects of the present invention is suitably configured to protect the PCB modules 312 against EMI/RFI. Accordingly, with reference to FIG. 3, when all of the slots 303 available in the IMA cabinet 300 are not fully populated with PCB modules 312, then a face plate 313 without printed circuit boards 314 and 315 is suitably secured to the empty slot. Similarly, with reference to FIGS. 4 and 6, when all of the connector openings 404 are not populated, then a cover plate 606 is suitably secured to the empty openings. In this manner, the IMA cabinet 300 is suitably sealed to be EMI/RFI resistant.

In accordance with various aspects of the present invention, the IMA cabinet 300 is suitably configured such that substantially all of the electronic and/or computer components and associated wiring are disposed on the PCB modules 312. Accordingly, the PCB modules 312 provide the various functionalities, such as power function, interface function, processing function, and the like, of the IMA cabinet 300.

For example, at least one of the PCB modules 312 of the IMA cabinet 300 can be configured as a circuit interface module. As described above, with reference to FIG. 4, the PCB modules 312 according to various aspects of the present invention are interconnected using the common bus 610 (FIG. 6) and directly connected to the wiring harness 1200 (FIG. 12) without using cables or flexprint interconnections. Accordingly, the PCB module 312 configured as the circuit interface module for the IMA cabinet 300 can suitably integrate and allocate the various signals and outputs received and transmitted between the PCB modules 312 and various systems connected to the wiring harness 1200 (FIG. 12) of the airplane's wiring system. As the PCB modules 312 can be disconnected from the wiring harness 1200 (FIG. 12) without accessing the rear panel 304 of the chassis 302, the wiring or interface configuration of the IMA cabinet 300 can be easily and quickly changed by removing the PCB module 312 configured as the circuit interface module and either reconfiguring it or replacing it. Similarly, damaged PCB modules 312 can be easily and quickly removed to be replaced or repaired.

The PCB module 312 configured as the circuit interface module for the IMA cabinet 300 according to various aspects of the present invention can include a circuit board with the desired wiring configurations formed on the circuit board. This configuration is particularly advantageous for applications such as in flight critical applications where speed and reliability is desired. In another configuration, the circuit interface module for the IMA cabinet 300 according to various aspects of the present invention can include a bread board with jumpers to form the desired wiring configuration. This configuration is particularly advantageous for non-flight critical applications where frequent changes may be made to the wiring configuration, such as for a passenger entertainment system.

It should be recognized that any number of the PCB modules 312 of the IMA cabinet 300 can be configured as circuit interface modules. For example, all of the PCB modules 312 of an IMA cabinet can be configured as circuit interface modules to form an interface cabinet. The IMA cabinet configured as a circuit interface cabinet can then provide circuit interface functionality to other electronic systems in the airplane. In this manner, the circuit interface functionality of an avionics system can be centrally located for diagnosis, upgrade, reconfiguration, repair, and the like.

Additionally, as alluded to above, the PCB modules 312 can be configured to perform various other functions. For example, at least one of the PCB modules 312 can be configured as a power supply module. Accordingly, the PCB modules 312 configured as the power supply module suitably regulates and supplies power to each of the PCB modules 312 contained within the IMA cabinet 300. Similar to the PCB module 312 configured as an interface module, the PCB module 312 configured as a power supply module can be easily and quickly removed to be to reconfigured, repaired, replaced, and the like. Additionally, all of the PCB modules 312 of an IMA cabinet can be configured as power supply modules to form a power supply cabinet.

Although the present invention has been described in conjunction with particular embodiments illustrated in the appended drawing figures, various modifications may be made without departing from the spirit and scope of the invention. Therefore, the present invention should not be construed as limited to the specific form shown and described above.

What is claimed:

1. An integrated modular avionics (IMA) cabinet comprising:
    a plurality of printed circuit board (PCB) modules, wherein each PCB module including a faceplate and a connector assembly disposed opposite said faceplate such that each PCB module is enclosed; wherein said faceplate has a first end and opposite second end;
    a chassis having a front, wherein said front of said chassis is configured with slots for receiving said plurality of PCB modules, and wherein said plurality of printed circuit board modules creates a seal with said chassis:
    a first screw for attaching said first end of said face plate to said chassis; and
    a second screw for attaching said second end of said face plate to said chassis, wherein said first and second screws are configured to clutch when said screws are tightened to apply a predetermined amount of force between said face plate of the PCB module and said chassis.

2. The IMA cabinet in accordance with claim 1, wherein said first screw is configured as a jack screw.

3. The IMA cabinet in accordance with claim 1, wherein said predetermined amount of force applies a load of about 70 pounds per screw.

4. An integrated modular avionics (IMA) cabinet comprising:
    a plurality of printed circuit board (PCB) modules, wherein each PCB module including a faceplate and a connector assembly disposed opposite said faceplate such that each PCB module is enclosed; wherein said faceplate has a first end and opposite second end, and wherein said connector assembly further comprise a plurality of connector for connecting to wire harnesses;
    a chassis having a front, wherein said front of said chassis is configured with slots for receiving said plurality of PCB modules, and wherein said plurality of printed circuit board modules creates a seal with said chassis:
    a first screw for attaching said first end of said face plate to said chassis; and
    a second screw for attaching said second end of said face plate to said chassis,
    a first circuit board having a first end connected to said face plate and an opposite second end connected to said connector assembly; and
    a second circuit board having a first end connected to said face plate and an opposite second end connected to said connector assembly, wherein said second circuit board is disposed adjacent said first circuit board.

5. The IMA cabinet in accordance with claim 4, wherein said first circuit board and said second circuit board are connected to said connectors without using ribbon cables or flexprint interconnections.

6. The IMA cabinet in accordance with claim 5, wherein said first circuit board and said second circuit board are connected to said connectors with surface mounted leads.

7. The IMA cabinet in accordance with claim 5, wherein said first circuit board and said second circuit board are connected to said connectors with 90 degree leads.

* * * * *